United States Patent

Kono et al.

[11] Patent Number: 6,037,781
[45] Date of Patent: Mar. 14, 2000

[54] MEASUREMENT OF ELECTRICAL CHARACTERISTICS OF SEMICONDUCTOR WAFER

[75] Inventors: Motohiro Kono; Tatsufumi Kusuda, both of Kyoto, Japan

[73] Assignee: Dainippon Screen Mfg. Co., Ltd., Japan

[21] Appl. No.: 09/046,348

[22] Filed: Mar. 23, 1998

[30] Foreign Application Priority Data

Mar. 25, 1997 [JP] Japan ................................. 9-090258

[51] Int. Cl.⁷ ........................... G01R 31/26; G01N 27/00
[52] U.S. Cl. .......................... 324/537; 324/73.1; 324/662; 324/765
[58] Field of Search .................................. 324/73.1, 662, 324/663, 671, 687, 690, 96, 753, 754, 765, 337; 250/306, 307, 492.2, 559.01, 559.09, 559.26; 356/373, 381, 400

[56] References Cited

U.S. PATENT DOCUMENTS

| | | | |
|---|---|---|---|
| 5,140,272 | 8/1992 | Nishimatsu et al. | 324/662 |
| 5,225,690 | 7/1993 | Sakai et al. | 250/559.09 |
| 5,233,291 | 8/1993 | Kouno et al. | 324/765 |
| 5,507,437 | 4/1996 | Hirea et al. | 324/765 |
| 5,566,252 | 10/1996 | Kasua et al. | 324/765 |

FOREIGN PATENT DOCUMENTS 5-2678422 10/1993 Japan .
5-77336 10/1993 Japan .

OTHER PUBLICATIONS

M. Kohn, et al., "Noncontact Measurement of Generation Lifetime", *Jpn. J. App. Phys.*, vol. 35, 1996, pp. 5539–5544. Month unavailable.

J.S. Kang et al., "The Pulsed MIS Computer", Phys. stat. Sol. (a) 89, 13–43, 1985. Month unavailable W. Keller, "The Rapid Measurement of Generation Lifetime in MOS Capacitors With Long Relaxation Times", *IEEE Transactions on Electron Devices,* vol. Ed–34, No. 5, May 1987.

J. Muller, et al., "Trnsient Responses of A Pulsed MIS–Capacitor", *Solid–State* Electronics, 1970, vol. 13, pp. 1319–1332. Month unavailable.

*Primary Examiner*—Diep N. Do

[57] ABSTRACT

C-V measurement is first carried out with respect to a target area on a semiconductor wafer using a measuring electrode located over the target area. Parameters used for C-t measurement of the target area (for example, applied voltages Vacc and Vmeas or a recovery time Tr) are then obtained from a C-V characteristic obtained by the C-V measurement. C-t measurement is subsequently carried out with respect to the target area using these parameters.

13 Claims, 10 Drawing Sheets

TYPICAL C-t MEASUREMENT

Fig. 1(A)
APPLIED VOLTAGE

Fig. 1(B)
MEASURED CAPACITANCE

Fig. 2

Zerbst PLOT

IDEAL C-V CHARACTERISTIC CURVE OF p-TYPE WAFER (Vfb=0)

DETERMINATION OF VOLTAGES (Vacc, Vmeas)
FOR C-t MEASUREMENT (p-TYPE)

MEASUREMENT OF ELECTRICAL CHARACTERISTICS OF SEMICONDUCTOR WAFER

BACKGROUND OF THE INVENTION

1. Field of the Invention

The present invention relates to a technique of measuring electrical characteristics of semiconductor wafers and more specifically to a technique of carrying out C-V measurement and C-t measurement.

2. Description of the Related Art

Figures 1A, 1B:
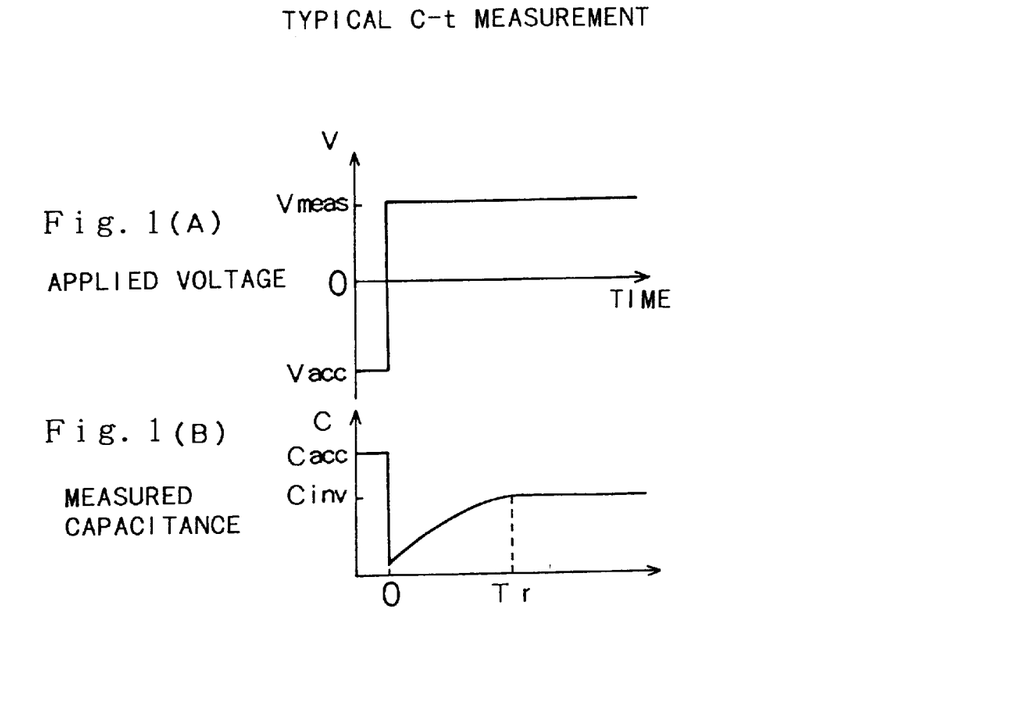
FIGS. 1(A) and 1(B) show graphs showing a typical process of C-t measurement.

The C-t (capacitance-time) measurement is one of the known methods for evaluating semiconductor wafers: for example, the crystal structure of semiconductor wafers. FIGS. 1(A) and 1(B) show a typical process of C-t measurement. The process of C-t measurement first locates a measuring electrode on a semiconductor wafer with an insulating film (or an air gap) between them to construct an MIS (metal-insulator-silicon) structure. As shown in FIG. 1(A), at the time of starting C-t measurement, a voltage Vacc is applied to the measuring electrode to set a target area on the surface of the semiconductor wafer in an accumulating state. This voltage Vacc will be hereinafter referred to as the 'accumulation voltage.' An electrostatic capacity measured by the measuring electrode at that time is called 'accumulation capacitance Cacc'. A voltage Vmeas is then applied stepwise to the measuring electrode to set the target area in an inverting state. The voltage Vmeas will be hereinafter referred to as the 'measurement voltage' or the 'inversion voltage'. The C-t characteristic means a transient change of the measured capacitance after the stepwise change of the voltage. The result of C-t measurement is continuously recorded until the measured capacitance reaches an inversion capacitance Cinv of the target area (that is, until a variation in measured capacitance against the time substantially reaches a plateau). A recovery time Tr, which is a time period between the time point when the applied voltage is changed stepwise to the measurement voltage Vmeas and the time point when the measured capacitance reaches the inversion capacitance Cinv, mainly depends upon the crystal structure of the semiconductor wafer and also upon the measurement voltage Vmeas.

Figure 2:
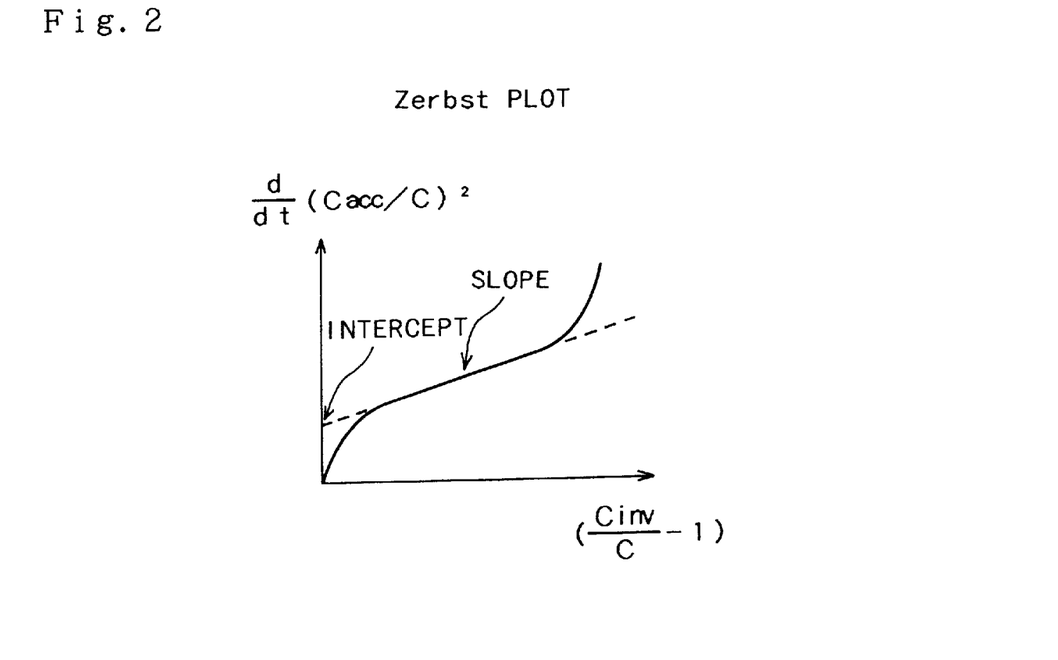
FIG. 2 is a Zerbst plot used for C-t measurement.

A known Zerbst plot shown in FIG. 2 is obtained from the C-t characteristic curve shown in FIG. 1(B). The slope of the plot determines values of a variety of physical parameters, such as a life time of minority carriers in the target area and a surface recombination rate of the minority carriers.

The shape of the C-t characteristic curve obtained by the C-t measurement significantly depends upon the voltages Vacc and Vmeas applied to the measuring electrode. Appropriate levels of these voltages Vacc and Vmeas depend upon the surface condition of the target area (for example, the quantity of movable ions near the surface). More concretely, if movable ions, such as $Na^+$, are included in an insulating film on the surface of the target area, for example, the flat-band voltage of the target area is shifted by the movable ions, thereby changing the appropriate levels of the voltages Vacc and Vmeas. In the prior art technique, since the C-t measurement is carried out with the voltages Vacc and Vmeas of predetermined constant levels, the measurement sometimes does not give any desired C-t characteristics. When a desired C-t characteristic is not obtained, the operator is required to adjust the voltage levels to carry out the C-t measurement again.

SUMMARY OF THE INVENTION

Accordingly, an object of the present invention is to provide a technique for readily obtaining a C-t characteristic according to the surface conditions of a target area on a semiconductor wafer.

In order to attain at least part of the above and other objects of the present invention, there is provided an apparatus for measuring electrical characteristics of a semiconductor wafer. The apparatus comprises: a C-V measurement unit which carries out C-V measurement of a target area of the semiconductor wafer while a measuring electrode is located over the target area; a parameter determination unit which determines parameters used for C-t measurement of the target area, based on a C-V characteristic obtained by the C-V measurement; and a C-t measurement unit which carries out C-t measurement of the target area using the parameters determined by the parameter determination unit. Since C-t measurement parameters are determined based on a C-V characteristic, the C-t characteristic will be readily obtained by the C-t measurement according to the surface condition of the target area of the semiconductor wafer.

In a preferred embodiment, the parameters determined by the parameter determination unit include an accumulation voltage to be applied to the measuring electrode at the time of starting the C-t measurement and a measurement voltage to be applied to the measuring electrode after the application of the accumulation voltage, as conditions of the C-t measurement. C-t measurement can be executed under appropriate conditions accordingly.

The parameter determination unit may comprise: a unit which determines a flat-band voltage from the C-V characteristic; and a unit which determines the accumulation voltage and the measurement voltage by adding predetermined differences to the flat-band voltage. This structure can determine appropriate values of the accumulation voltage and the measurement voltage, which are to be applied to the measuring electrode in the process of the C-t measurement.

In another embodiment, the parameter determination unit may comprise: a unit which determines the accumulation voltage and the measurement voltage based on a shape of a curve of the C-V characteristic. This structure can determine appropriate values of the accumulation voltage and the measurement voltage, without determining the flat-band voltage from the C-V characteristic.

The parameters determined by the parameter determination unit may further include a measurement time for recording a C-t characteristic after the applied voltage is changed from the accumulation voltage to the measurement voltage. An appropriate measurement time for the C-t characteristic can be thus determined according to the surface condition of the target area, thereby saving the measurement time.

The C-t measurement unit may cease from carrying out the C-t measurement when a deep depletion region does not appear in the C-V characteristic. If no deep depletion region is appeared in the C-V characteristic, the C-t measurement does not give any significant results. Cessation of the C-t measurement in this case preferably saves the measurement time for the useless C-t measurement.

According to an aspect of the present invention, there is provided a method of measuring electrical characteristics of a semiconductor wafer. The method comprises the steps of: (a) carrying out C-V measurement of a target area of the semiconductor wafer while a measuring electrode is located over the target area; (b) determining parameters used for C-t measurement of the target area, based on a C-V characteristic obtained by the C-V measurement; and (c) carrying out C-t measurement of the target area using the parameters determined at the step (b).

The present invention is also directed to a computer program product for implementing the functions of the above apparatus or method.

These and other objects, features, aspects, and advantages of the present invention will become more apparent from the following detailed description of the preferred embodiments with the accompanying drawings.

DESCRIPTION OF THE PREFERRED EMBODIMENT

A. Structure of Apparatus

Figure 3:
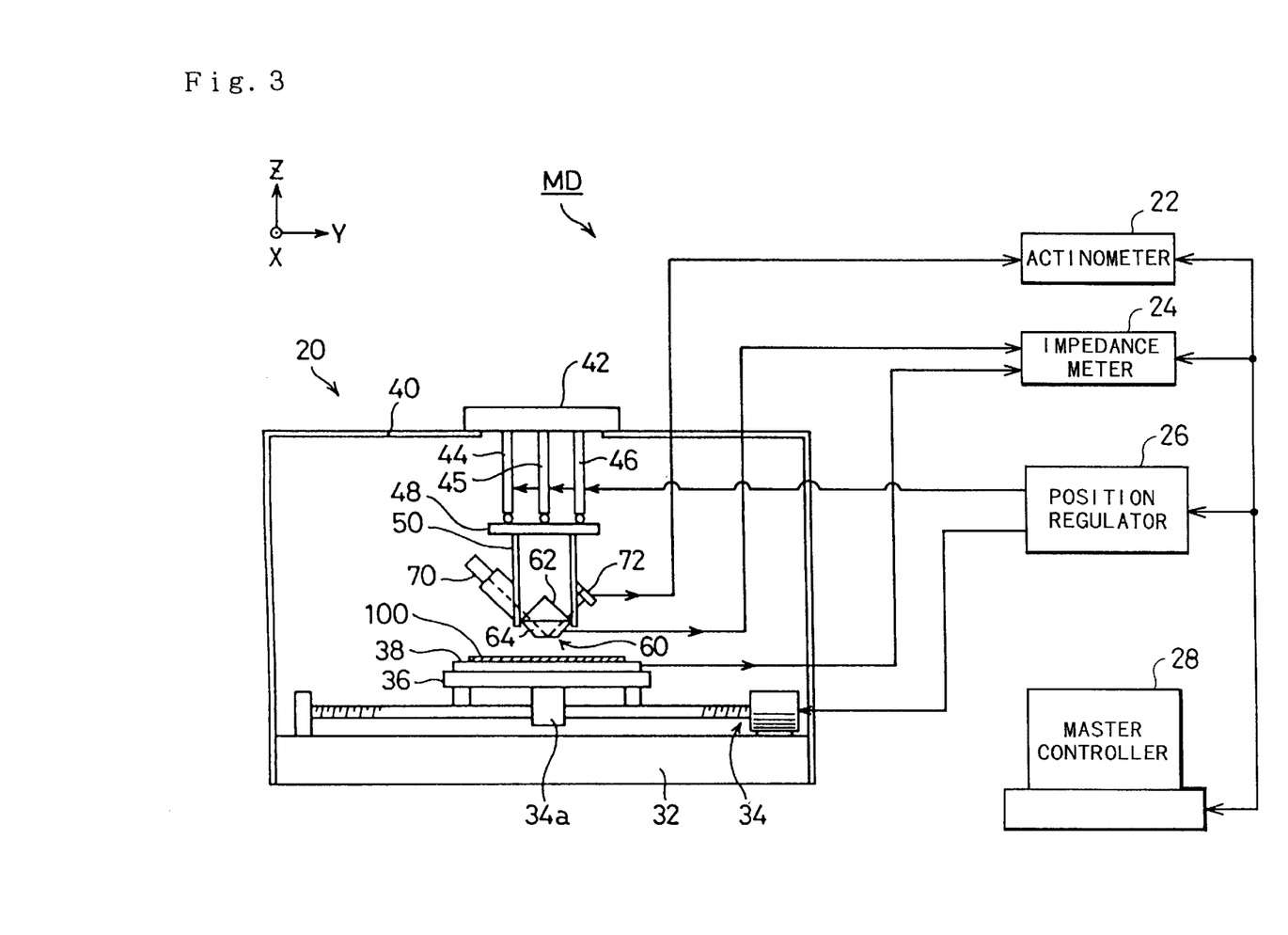
FIG. 3 illustrates the structure of an electrical characteristics measurement device MD of a non-contact type embodying the present invention.

FIG. 3 conceptually illustrates the structure of an electrical characteristics measurement device MD of a non-contact type embodying the present invention. The measurement device MD comprises a measurement unit 20 which accommodates a semiconductor wafer 100 therein, an actinometer 22, an impedance meter 24, a position regulator 26, and a master controller 28. The actinometer 22, the impedance meter 24, and the position regulator 26 are coupled to the master controller 28, which controls the whole measurement device and processes the measured data. The master controller 28 may be implemented by a personal computer. The master controller 28 executes computer programs to carry out measurement of electrical characteristics such as C-V measurement and C-t measurement.

The measurement unit 20 comprises a base 32, a driving unit 24 disposed on the base 32, a stand 36 linked with a ball thread element 34a of the driving unit 34, and a sample table 38 mounted on the stand 35. The semiconductor wafer 100 as a measurement sample is set on the sample table 38, which is driven by a non-illustrated motor to revolve within an X-Y plane.

A flange 42 is fixed by a bolt to the upper opening of a casing 40 of the measurement unit 20. Three piezoelectric actuators 44, 45, and 46 utilizing piezoelectric elements are arranged below the flange 42. A support plate 48 is further disposed below the piezoelectric actuators 44, 45, and 46. A sensor head 60 is fixed to a lower end of a support cylinder 50 extending downward from the support plate 48. The support plate 48 is linked with the flange 42 by a plurality of non-illustrated springs and presses up the piezoelectric actuators 44, 45, and 46 toward the flange 42. The sensor head 60 includes a right-angle prism 62 for receiving a laser beam and a translucent electrode-holder element 64 bonded to the bottom face of the right-angle prism 62 with an optical adhesive.

A laser 70, such as a GaAlAs laser, and a light-receiving sensor 72, such as a photo diode, are fixed to the support cylinder 50. A laser beam emitted from the laser 70 passes through the right-angle prism 62, is introduced into the electrode-holder element 64, and is reflected by the bottom face of the electrode-holder element 64 under the geometric optical total reflection conditions. The reflected light beam goes through the right-angle prism 62 and is received by the light-receiving sensor 72.

For measurement of electrical characteristics of the semiconductor wafer 100, the gap between the bottom face of the sensor head 60 and the surface of the semiconductor wafer 100 is kept to be about not greater than 1 $\mu$m. The optical system consisting of the laser 70, the sensor head 60, and the light-receiving sensor 72 is an optical measurement system for accurately measuring this gap. The optical measurement system takes advantage of the tunneling effect of the laser beam, which is emitted from the laser 70 and reflected by the bottom face of the sensor head 60 under the geometric optical total reflection conditions, and determines the value of the gap based on the quantity of light measured by the light-receiving sensor 72 and the actinometer 22. The details of the method of measuring such a gap is disclosed in U.S. Pat. No. 5,225,690, the disclosure of which is herein incorporated by reference for all purposes.

The piezoelectric actuators 44, 45, and 46 are electrically coupled to the position regulator 26. The light-receiving sensor 72 is coupled to the actinometer 22, whereas the impedance meter 24 is coupled to the electrode formed on the bottom face of the sensor head 60 and to the metal sample table 38. The impedance meter 24 measures the capacitance or conductance between each electrode and the sample table 38.

Figure 4A:
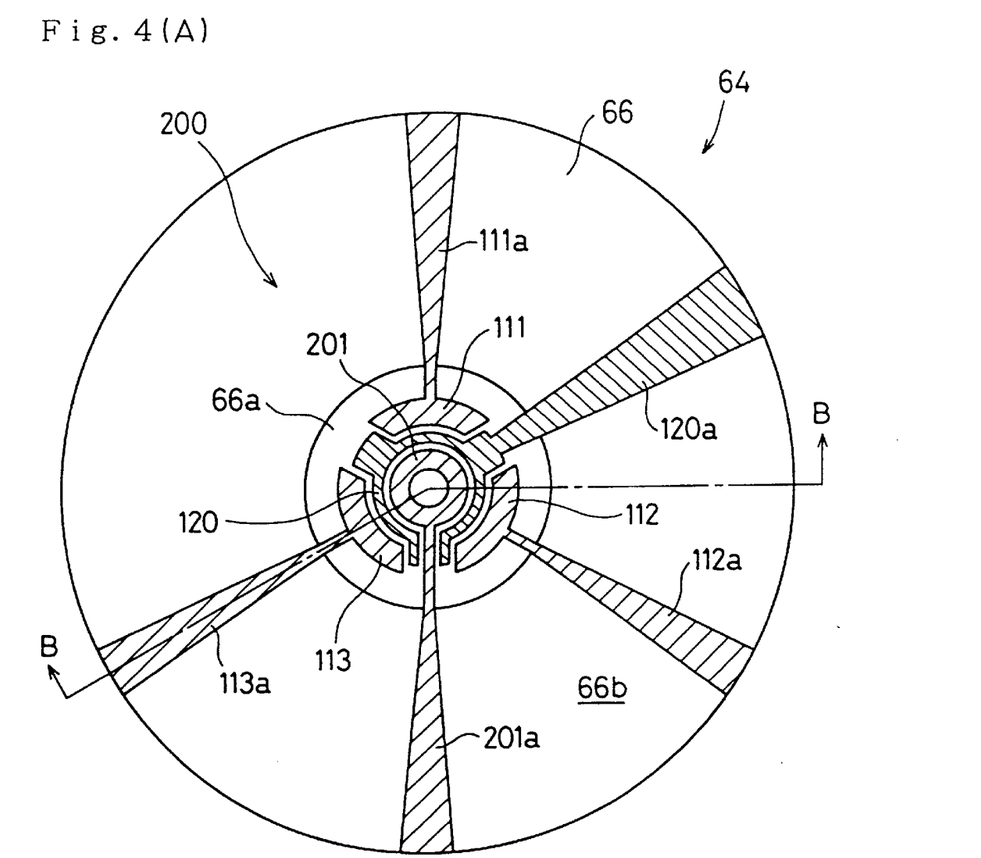
FIG. 4(A) shows the bottom face of the electrode-holder element 64.
Figure 4B:
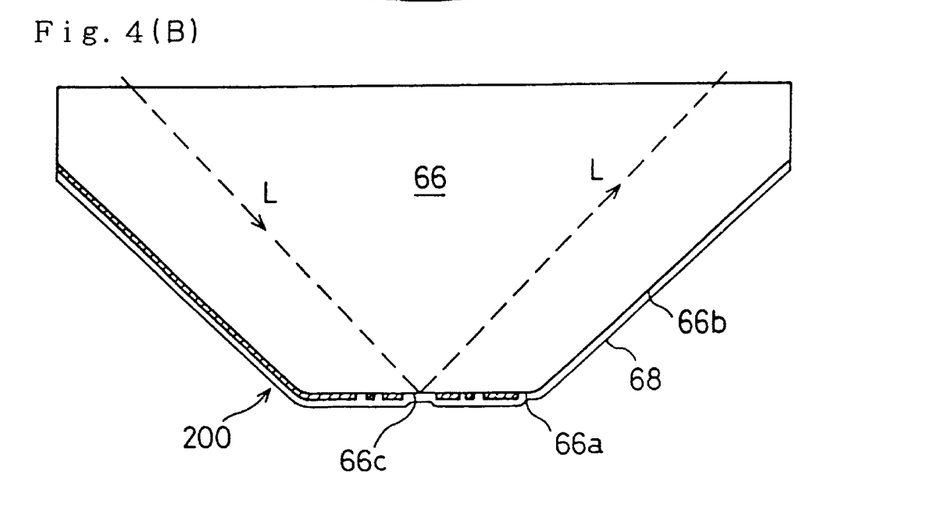
FIG. 4(B) shows the cross section of the element 64 taken on the line B—B.

FIG. 4(A) is a bottom view of the electrode-holder element 64, and FIG. 4(B) is its cross sectional view taken on the line B—B. The electrode-holder element 64 includes a cone glass 66 made of optical glass, an electrode pattern 200 formed on a bottom face 66a of the cone glass 66, and an insulating film 68 for covering the bottom face 66a and a curved surface 66b of the cone glass 66. The electrode pattern 200 includes a measuring electrode 201 for measuring electrical characteristics, three parallelism-adjusting electrodes 111–113, and a guard ring 120 as well as wiring 201a, 111a–113a, and 120a respectively coupled to the electrodes 201, 111–113, and 120. The wiring is formed over the bottom face 66a and the curved surface 66b of the cone glass 66.

The measuring electrode 201 for measuring electrical characteristics has a ring shape. The surface of the cone glass 66 exposed on the center of the electrode 201 forms a reflection plane 66c, by which a laser beam L is totally reflected in terms of geometrical optics.

The parallelism-adjusting electrodes 111–113 are used for adjusting the parallelism between the bottom face 66a of the cone glass 66 and the surface of the semiconductor wafer 100. The slope of the bottom face 66a of the cone glass 66 is adjusted by regulating the expansion of the piezoelectric elements of the piezoelectric actuators 44, 45, and 46, so as to make the capacities of the respective electrodes 111–113 equal to one another. This enables the bottom face 66a of the cone glass 66 to be parallel to the surface of the semiconductor wafer 100.

The radio-frequency sputtering is used to form the insulating film 68 of silicon oxide ($SiO_2$) of about 50 nm. Available materials for the insulating film 68 other than silicon oxide include silicon nitride ($Si_3N_4$) and a variety of plastics. The insulating film 68 of any such material may be formed by CVD (chemical vapor deposition, including heat CVD and plasma CVD) or PVD (physical vapor deposition). In another example, the insulating film 68 of silicon oxide can be formed by thermal oxidization of polysilicon accumulated on the cone glass 66. In still another example, the insulating film 68 of metal oxides, such as $Cr_2O_3$, $Al_2O_3$, and $Ta_2O_3$ can be formed by means of thermal oxidization or anodic oxidation. The above processes have an advantage of accurately regulating the thickness of the insulating film 68. In still another available process, the insulating film 68 can be formed by applying $SiO_2$ glass with SOG (spin on glass) or Teflon (trade name of polytetrafluoroethylene) on the wafer.

The sensor head 60 shown in FIGS. 4(A) and 4(B) enables measurement of C-V characteristics of semiconductor wafers having bare surfaces and semiconductor wafers whose insulating films have many defects on the surface thereof. The electrode covered with the insulating film 68 is not in direct contact with the semiconductor wafer; this structure effectively prevents a short circuit between the electrode and the semiconductor wafer.

Figure 5:
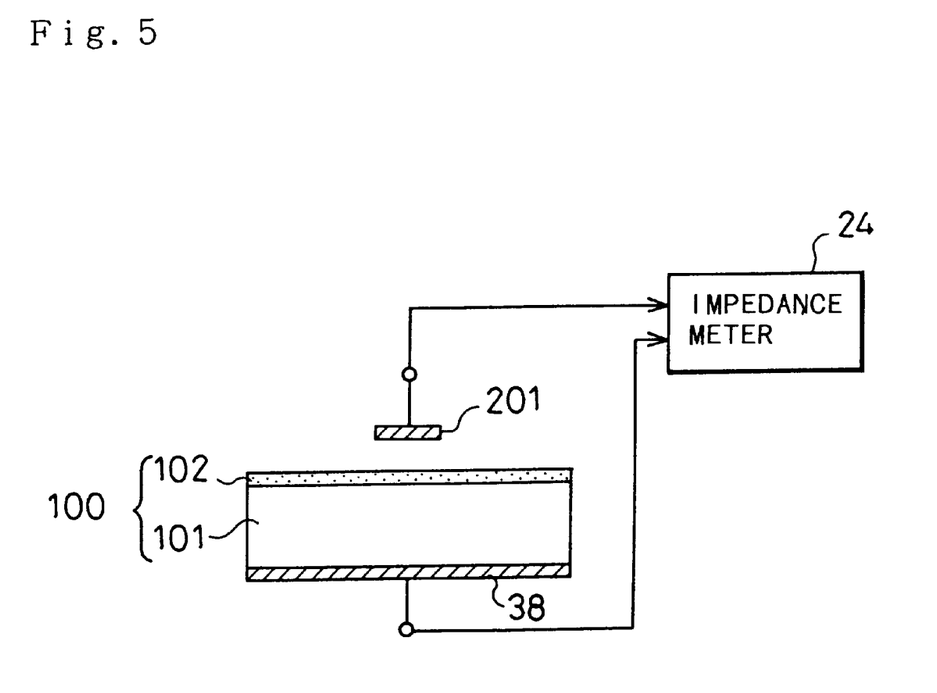
FIG. 5 shows a connection of the electrodes with the impedance meter 24 used for the measurement of electrical characteristics.

FIG. 5 shows a connection of the electrodes with the impedance meter 24 used for the measurement of electrical characteristics. As described previously, the measuring electrode 201 (FIG. 4(A)) held in the electrode-holder element 64 is kept above the semiconductor wafer 100 via a gap of about 0.3 μm. In the example of FIG. 5, an insulating film 102 is formed on the surface of a substrate 101 of the semiconductor wafer 100. The semiconductor wafer 100 is mounted on the conductive sample table 38 (FIG. 3). The sample table 38 is used as the electrode that is in contact with the rear face of the semiconductor wafer. The measuring electrode 201 and the sample table 38 are electrically coupled to terminals of the impedance meter 24. The impedance meter 24 accordingly measures electrical characteristics between the two electrodes 201 and 38. The master controller 28 analyzes the results of measurement obtained by the impedance meter 24 and determines a variety of electrical characteristics regarding a target area in the semiconductor wafer.

Figure 6:
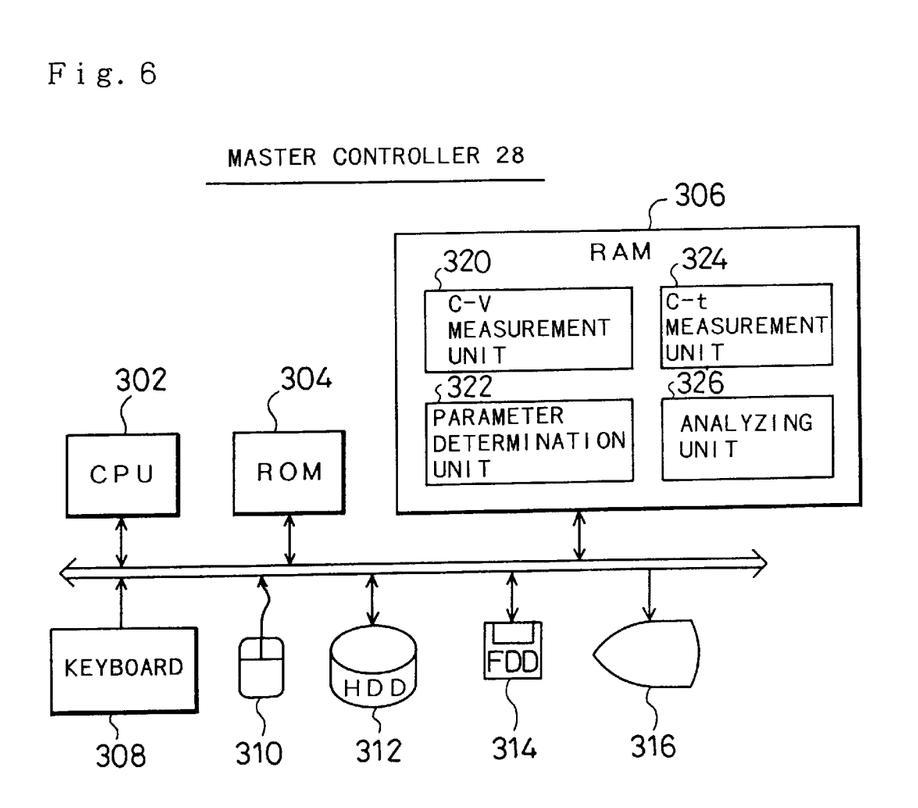
FIG. 6 is a block diagram illustrating the internal structure of the master controller 28.

FIG. 6 is a block diagram illustrating the internal structure of the master controller 28. The master controller 28 includes a CPU 302, a ROM 304 and a RAM 306 functioning as main memories, a keyboard 308, a mouse 310, a hard disk 312, a flexible disk 314, and a display device 316. The respective interface circuits are omitted from the illustration of FIG. 6.

Computer programs for carrying out a variety of processes in this embodiment are stored in the RAM 306. The computer programs implements the functions of a C-V measurement unit 320, a parameter determination unit 322, a C-t measurement unit 324, and an analyzing unit 326.

The computer programs (applications programs) for implementing the functions of the respective units are recorded on a portable storage medium, such as the flexible disk 314 or a CD-ROM, and transferred from the storage medium to the RAM 306 or to the hard disk 312 or external storage device of the computer system. Alternatively the computer programs may be supplied from a program supply apparatus to the computer system via a communications path. The computer programs are transferred to the RAM 306 and stored therein to be executed. In the specification hereof, the computer system implies both the hardware and its operating system and more specifically represents the hardware operating under the control of the operating system. The applications programs enable the computer system to implement the functions of the respective units. Part of these functions may be implemented by the operating system instead of the applications programs.

The 'storage medium' in the present invention is not restricted to the portable storage media noted above, but includes a variety of internal storage devices in the computer, for example, RAMs and ROMs, and external storage devices coupled to the computer, for example, hard disks. Namely the 'storage medium' of the present invention implies any computer readable media.

B. First Embodiment

Figure 7:
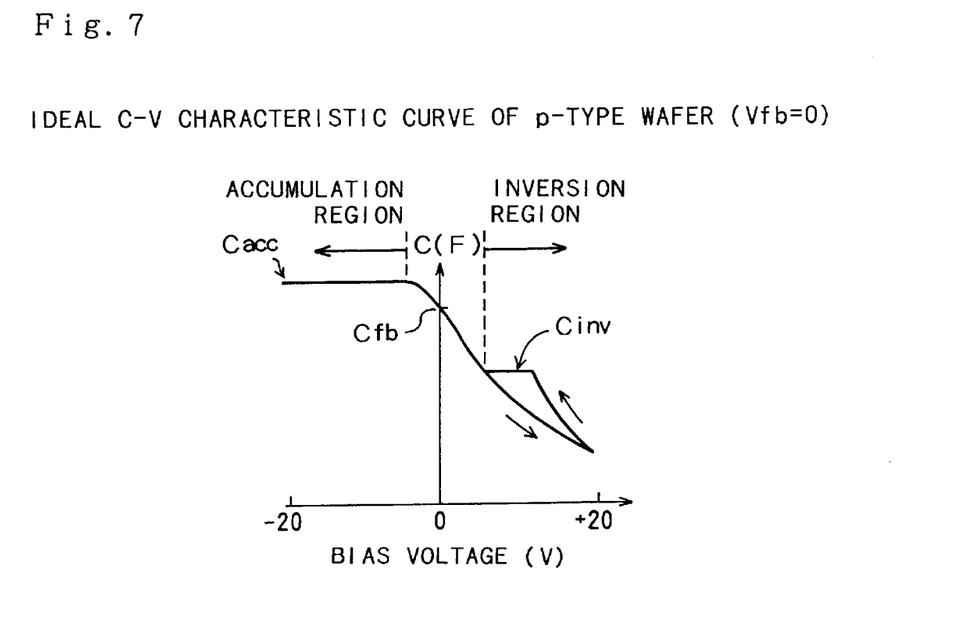
FIG. 7 is a graph showing an ideal C-V characteristic curve of a p-type wafer as an example.

The following describes a method of determining applied voltages Vacc and Vmeas for C-t measurement based on a C-V characteristic as a first embodiment according to the present invention. FIG. 7 is an exemplary graph showing an ideal C-V characteristic curve of a p-type wafer. The 'ideal C-V characteristic' here means a C-V characteristic whose flat-band voltage Vfb is equal to 0 volt. As is well known, the flat-band voltage Vfb is is a voltage level that gives a flat-band capacitance Cfb, which can be calculated in advance with respect to a target area.

In the C-V characteristic curve of FIG. 7, a plateau in the range of negative bias voltage shows that the vicinity of the surface of the target area in the semiconductor wafer is in an accumulation state. This segment of the curve is accordingly referred to as an accumulation region. A flat portion in the range of positive bias voltage, on the other hand, shows that the vicinity of the surface of a target area in the semiconductor wafer is in an inversion state. This segment of the curve is accordingly referred to as an inversion region. The accumulation voltage Vacc (FIG. 1) for C-t measurement is selected among the voltages in the range of the accumulation region, whereas the measurement voltage Vmeas is selected among the voltages in the range of the inversion region. For example, the accumulation voltage Vacc is set equal to minus 20 volts, and the measurement voltage Vmeas to plus 20 volts.

Figure 8:
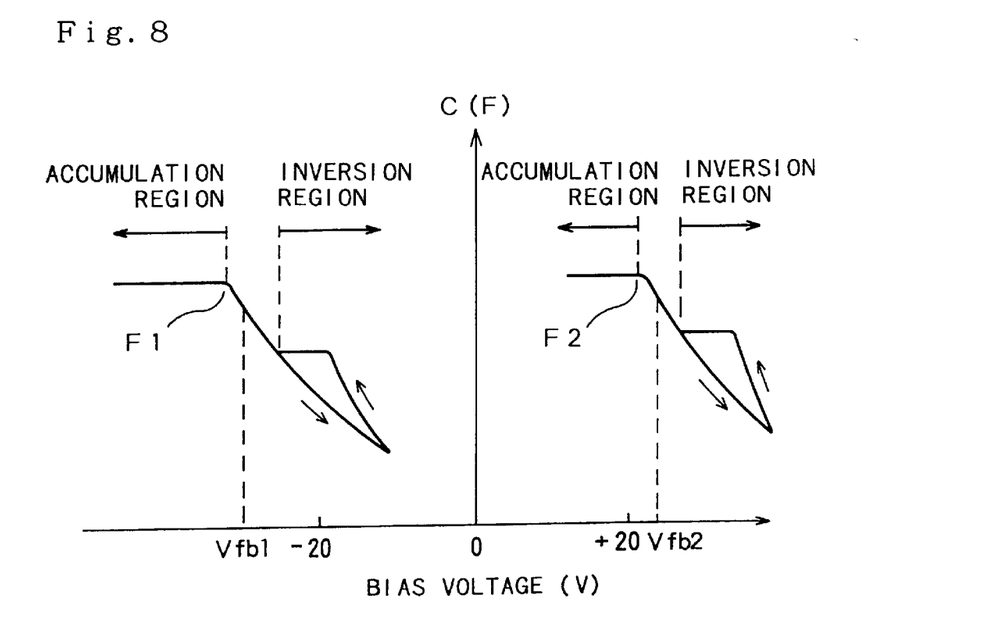
FIG. 8 is a graph showing actual C-V characteristic curves as examples.

An actual C-V characteristic curve is, however, generally shifted leftward or rightward from the ideal C-V characteristic curve. FIG. 8 is a graph showing actual C-V characteristic curves as examples. A first C-V characteristic curve F1 shown in the left half of FIG. 8 has a flat-band voltage Vfb1 which is significantly shifted to the negative side. Such a characteristic curve F1 is obtained, for example, when a relatively large amount of positive electrical charges (for example, $Na^+$) exist in the insulating film 102 (FIG. 5). A second C-V characteristic curve F2 shown in the right half of FIG. 8, on the other hand, has a flat-band voltage Vfb2 which is significantly shifted to the positive side. If the flat-band voltage is significantly shifted from 0 volt like these examples, their accumulation region and the inversion region are also remarkably shifted from the positions in the ideal characteristic curve shown in FIG. 7. By taking into account such a shift of the C-V characteristic curve, it is not proper to set the voltages Vacc and Vmeas for C-t measurement at fixed values. These voltages Vacc and Vmeas are determined according to the surface conditions of the target area in this embodiment.

As clearly understood from the two characteristic curves F1 and F2 shown in FIG. 8, even when an actual C-V characteristic curve is significantly shifted from the ideal curve, the accumulation region and the inversion region exist in predetermined ranges on either side of the flat-band voltage Vfb. The voltages Vacc and Vmeas to be used for C-t measurement can be determined according to the C-V characteristic by utilizing this relation.

Figure 9:
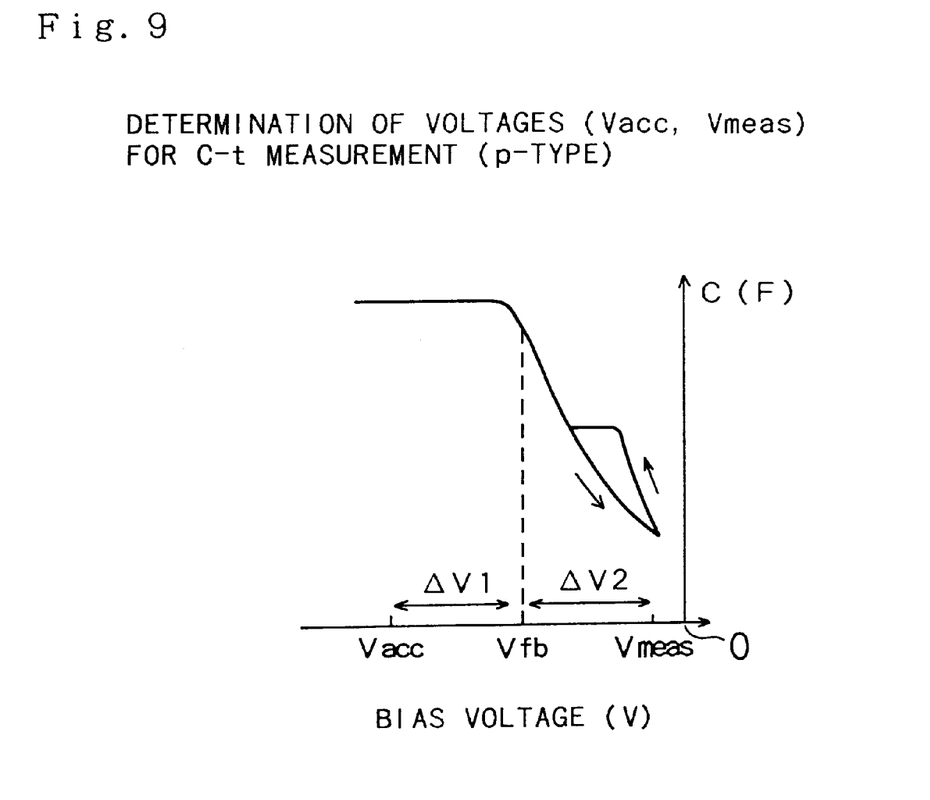
FIG. 9 shows a concrete process of determining the applied voltages for C-t measurement in a first embodiment according to the present invention.

FIG. 9 shows a concrete process of determining the voltages Vacc and Vmeas for C-t measurement in the first embodiment. The process of the first embodiment first carries out C-V measurement with respect to a target area to obtain a C-V characteristic curve. The C-V characteristic curve shown in FIG. 9 corresponds to an example when the conduction in the vicinity of the surface of the target area is of a p-type. The process then analyzes the C-V characteristic to determine the flat-band voltage Vfb. The concrete procedure of C-V measurement and the process of determining the flat-band voltage Vfb based on the C-V characteristic are known in the field of measuring electrical characteristics of semiconductor wafers and are thus not specifically described here.

If the conduction in the vicinity of the surface of the target area is of a p-type, the accumulation voltage Vacc, which is the initial applied voltage for C-t measurement, is calculated by subtracting a predetermined first deviation ΔV1 from the flat-band voltage Vfb. The measurement voltage Vmeas is, on the other hand, calculated by adding a predetermined second deviation ΔV2 to the flat-band voltage Vfb. When the first deviation ΔV1 is defined as a negative value, the accumulation voltage Vacc and the measurement voltage Vmeas are obtained by adding the respective deviations ΔV1 and ΔV2 to the flat-band voltage Vfb. The absolute values of these deviations ΔV1 and ΔV2 are preferably in the range of about 20 to 30 volts. The absolute values of the first and the second deviations ΔV1 and ΔV2 may be equal to or different from each other.

The values of these deviations ΔV1 and ΔV2 depend upon the air gap between the measuring electrode 201 and the surface of the target area as well as upon the thickness of the insulating film 102 in the surface of the target area. The above range of about 20 to 30 volts is preferable if the air gap is about 0.3 to 0.4 μm and the thickness of the insulating film is about 0.1 μm. The air gap can be set to a predetermined value, whereas the approximate thickness of the insulating film (including its existence or non-existence) on the surface of each target area is known. Namely the values of the deviations ΔV1 and ΔV2 suitable for each target area can be specified in advance according to the air gap and the thickness of the insulating film in the surface of the target area.

If the conduction in the vicinity of the surface of the target area is of an n-type, the above procedure for the p-type is applicable while the plus and minus signs of these deviations ΔV1 and ΔV2 are reversed.

Figure 10:
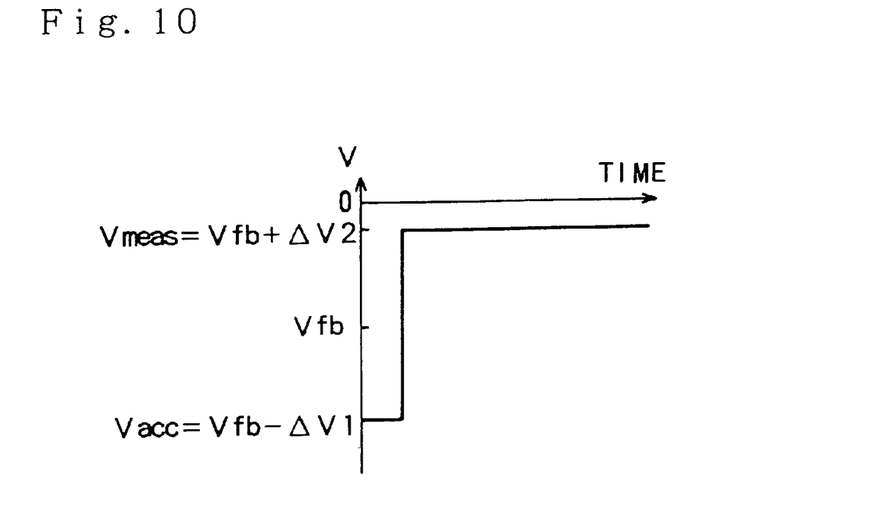
FIG. 10 shows a stepwise change of the applied voltage in the C-t measurement in the first embodiment.

As discussed above, the process of the first embodiment analyzes the C-V characteristic to determine the flat-band voltage Vfb and adds the predetermined deviations ΔV1 and ΔV2 to this flat-band voltage Vfb, so as to set appropriate values to the applied voltages Vacc and Vmeas for C-t measurement. FIG. 10 shows a stepwise change of applied voltage in the C-t measurement with these voltages Vacc and Vmeas thus determined.

Figure 11:
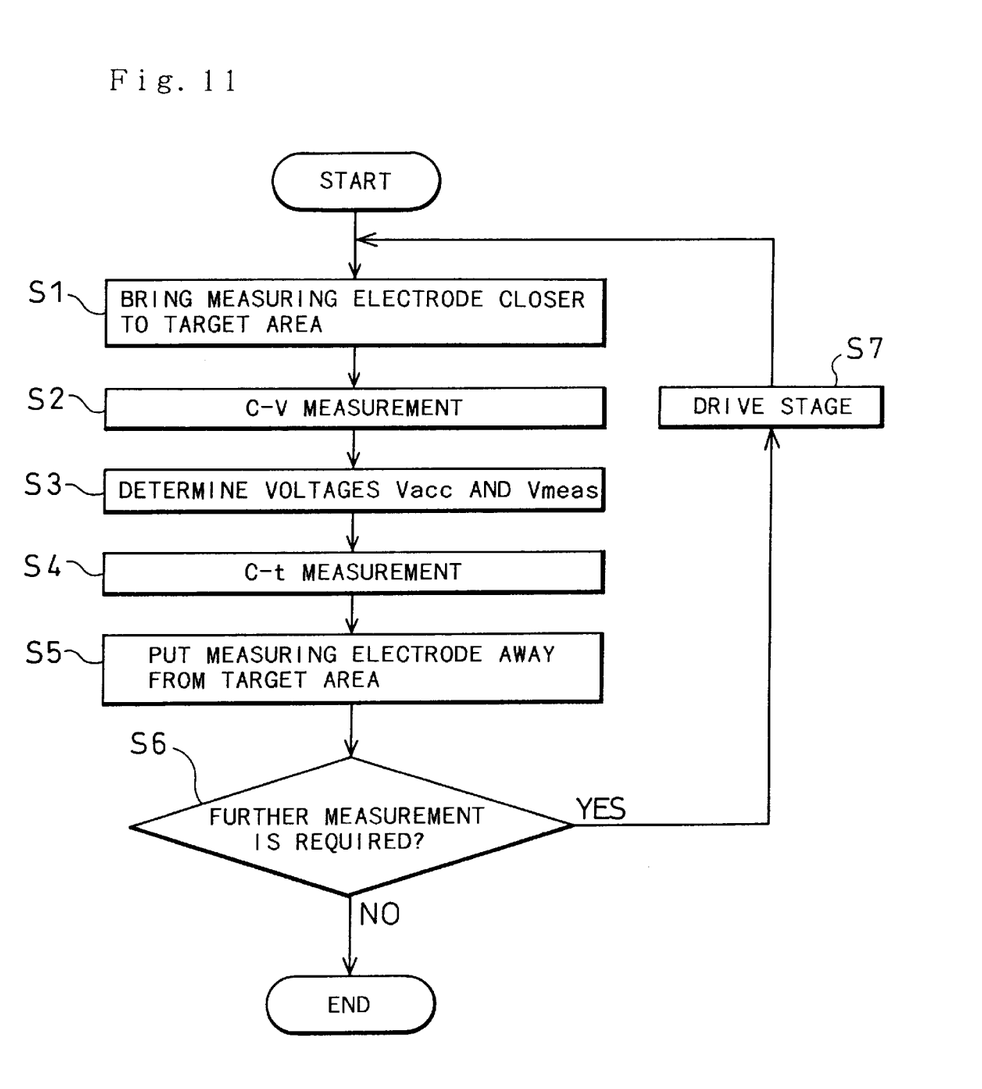
FIG. 11 is a flowchart showing a measurement routine executed in the first embodiment of the present invention.

FIG. 11 is a flowchart showing a measurement routine executed in the first embodiment of the present invention. In the routine of FIG. 11, it is assumed that a plurality of target areas have been specified in advance on the semiconductor wafer 100. When the program enters the routine, the measuring electrode 201 is brought closer to and above a first target area at step S1. The gap between the measuring electrode 201 and the semiconductor wafer 100 is kept, for example, about 0.3 μm. The C-V measurement unit 320 (FIG. 6) carries out C-V measurement with respect to the target area at step S2. At subsequent step S3, the parameter determination unit 322 determines the voltages Vacc and Vmeas for C-t measurement, based on the analysis of the results of C-V measurement. More concretely, the analyzing unit 326 actually analyzes the results of measurement, and the parameter determination unit 322 determines the voltages Vacc and Vmeas based on the results of analysis.

At step S4, the C-t measurement unit 324 carries out C-t measurement using the voltages Vacc and Vmeas determined at step S3. At subsequent step S5, the measuring electrode 201 is pulled upward away from the target area. It is then determined at step S6 whether or not measurement is to be continued. When further measurement is not required, the program exits from this routine. When further measurement is required, on the contrary, the program proceeds to step S7, at which the sample table 38 is driven to move the measuring electrode 201 to a position above a next target area. The above procedure is then repeated to carry out C-V measurement and C-t measurement with respect to the next target area. The routine of FIG. 11 is automatically executed by the computer program stored in the RAM 306 and does not require the operator to give any instructions.

As described above, the process of the first embodiment determines the flat-band voltage Vfb based on a C-V characteristic regarding each target area, and adds the predetermined deviations ΔV1 and ΔV2 to the flat-band voltage Vfb, so as to determine the applied voltages Vacc and Vmeas for C-t measurement. This process automatically determines appropriate values of the voltages Vacc and Vmeas without requiring the operator to specify the values of these voltages Vacc and Vmeas for C-t measurement while taking into account the surface conditions of each target area. Since this method determines the appropriate values of the voltages Vacc and Vmeas prior to the C-t measurement, only one cycle of C-t measurement will give a desired C-t characteristic for each target area. Another advantage of this method is accordingly that repeated cycles of C-t measurement are not required with respect to each target area while varying the measurement conditions. Especially if the C-t measurement is to be done with respect to a large number of target areas, this method can readily determine appropriate C-t measurement according to the surface conditions of each target area.

C. Second Embodiment

Figure 12:
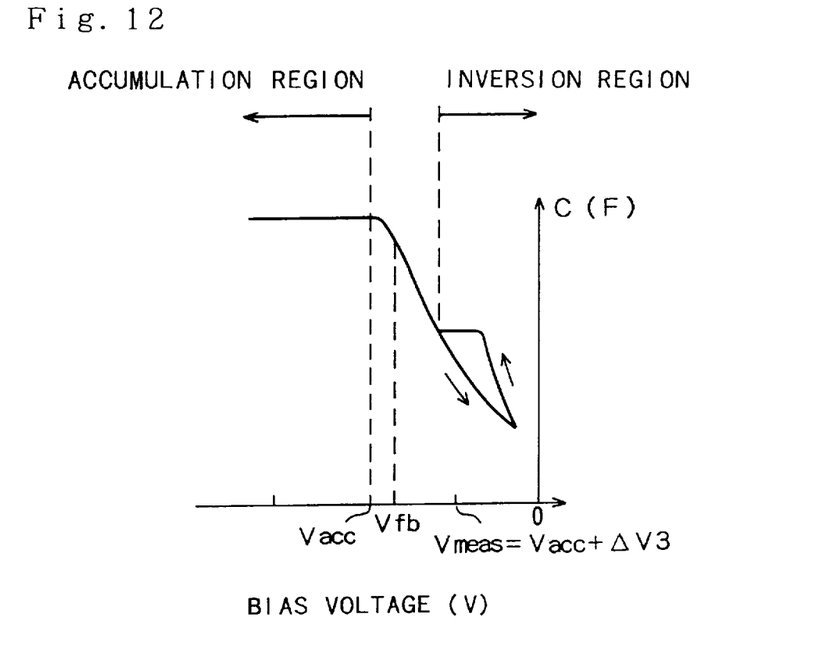
FIG. 12 shows a concrete process of determining the applied voltages for C-t measurement in a second embodiment according to the present invention.

FIG. 12 shows a concrete process of determining the applied voltages for C-t measurement in a second embodiment according to the present invention. As shown in FIG. 12, a C-V characteristic curve includes an accumulation region and an inversion region. The accumulation voltage Vacc for C-t measurement is set to a value in the range of the accumulation region, whereas the measurement voltage Vmeas is set to a value in the range of the inversion region. The process of the second embodiment determines the applied voltages Vacc and Vmeas for C-t measurement based on the shape of the C-V characteristic curve without determining the flat-band voltage.

The accumulation voltage Vacc is obtained from a plateau in the accumulation region of the C-V characteristic curve. In the example of FIG. 12, the voltage that is in the flat accumulation region of the C-V characteristic curve and proximate to the inversion region is selected as the accumulation voltage Vacc for C-t measurement. When the conduction of the target area is of a p-type like the example of FIG. 12, setting the accumulation voltage Vacc to a value of extremely negative voltage may cause an electrical stress in the target area. When the conduction of the target area is of an n-type, on the other hand, setting the accumulation voltage Vacc to a value of extremely positive voltage may cause an electrical stress in the target area. It is accordingly preferable that the accumulation voltage Vacc for C-t measurement is set to a voltage within the accumulation region (plateau) and closest possible to the inversion region.

The accumulation region of the C-V characteristic curve is in the negative range for the p-type target area and in the positive range for the n-type target area. When the conduction type of the target area is previously known, the accumulation voltage Vacc used for C-t measurement can be determined by analyzing only the plateau in the accumulation region. If the conduction type is unknown, on the other hand, the range where the measured capacitance shows the highest values in the C-V characteristic curve can be specified as the accumulation region. In this manner, the accumulation voltage Vacc can be obtained from the plateau of the measured capacitance.

The measurement voltage or inversion voltage Vmeas for C-t measurement can be obtained by adding a predetermined deviation $\Delta V3$ to the accumulation voltage Vacc in the second embodiment. Like the deviations $\Delta V1$ and $\Delta V2$ in the first embodiment, the deviation $\Delta V3$ is preset to an appropriate value according to the air gap between the measuring electrode 201 and the surface of each target area as well as the thickness of the insulating film on the surface of the target area. For example, when the air gap is about 0.3 to 0.4 $\mu$m and the thickness of the insulating film is about 0.1 $\mu$m, the preferable deviation $\Delta V3$ is about 40 volts.

A variety of methods other than that shown in FIG. 12 may be applicable to determine the applied voltages Vacc and Vmeas for C-t measurement based on the shape of the C-V characteristic curve. For example, since a flat portion also appears in the inversion region as shown in FIG. 12, the flat portions can be identified as the inversion region, and a voltage in the inversion region can be selected as the measurement voltage Vmeas for C-t measurement.

D. Other Processes of Determining Parameters for C-t measurement

In the first and the second embodiments described above, the applied voltages Vacc and Vmeas for C-t measurement are determined according to the C-V characteristic. Other parameters used for C-t measurement may be also obtained from the C-V characteristic. The following describes a process of determining the recovery time Tr (FIG. 1(B)) for C-t measurement based on the C-V characteristic.

As is known, the recovery time Tr for C-t measurement is expressed by Equation 1:

$$Tr = \frac{Nd \cdot Cacc}{ni \cdot Cinv} \tau_g \quad (1)$$

where Nd denotes a concentration of majority carriers, Cacc an accumulation capacitance, ni an intrinsic carrier concentration of the semiconductor substrate, Cinv an inversion capacitance, and $\tau g$ a life time of minority carriers in a target area.

The concentration of majority carriers Nd is obtained from a concentration of impurity dopant in the vicinity of the surface of the target area. The intrinsic carrier concentration ni is known. As described below, the approximate values of the life time $\tau g$ of minority carriers, the accumulation capacitance Cacc, and the inversion capacitance Cinv are determined with reference to the C-V characteristic.

Figure 13:
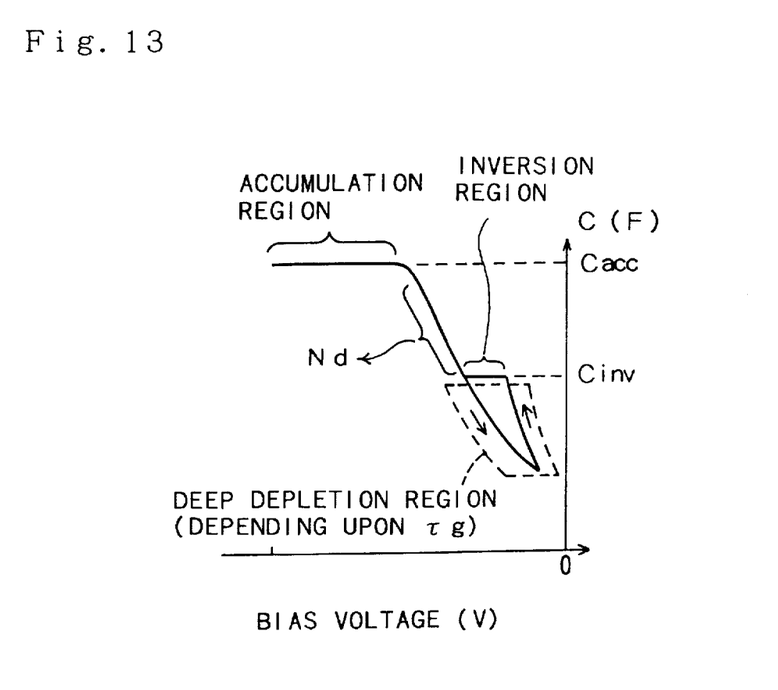
FIG. 13 shows a process of determining the approximate value of the life time τg of minority carriers, the accumulation capacitance Cacc, and the inversion capacitance Cinv based on the C-V characteristic.

FIG. 13 shows a process of determining the approximate values of the life time $\tau g$ of minority carriers, the accumulation capacitance Cacc, and the inversion capacitance Cinv based on the C-V characteristic. As shown in FIG. 13, the C-V characteristic curve generally includes an accumulation region, an inversion region, and a deep depletion region. The deep depletion region means that the vicinity of the surface of the target area is in a deep depletion state. These three regions are generally measured in the results of high-frequency C-V measurement. The 'high-frequency C-V measurement' here means the measurement process in which a d.c. voltage superposed upon a high-frequency signal is applied to the measuring electrode 201 in multiple steps.

The accumulation capacitance Cacc and the inversion capacitance Cinv are respectively obtained from the flat portion in the accumulation region and the flat portion in the inversion region. The life time $\tau g$ of minority carriers is approximated from the shape of the C-V characteristic curve in the inversion region and the deep depletion region. The method of calculating the life time $\tau g$ is described in detail in JAPANESE PATENT PUBLICATION GAZETTE No. 5-77336, the disclosure of which is herein incorporated by reference for all purposes.

By substituting the approximate values of the life time $\tau g$ of minority carriers, the accumulation capacitance Cacc, and the inversion capacitance Cinv thus determined into Equation (1) yields an approximate value of the recovery time Tr for C-T measurement. The C-t measurement is accordingly executed for the recovery time Tr plus some margin, in order to ensure the sufficient results of C-t measurement. This method of determining the recovery time Tr of C-t measurement based on the C-V characteristic can determine an appropriate actual time of C-t measurement according to the surface conditions of each target area, thereby saving the total time required for C-t measurement.

The recovery time Tr can be also determined from the C-V characteristic according to a method described in 'Non-contact measurement for generation time', Bulletin of Applied Physical Society of Japan, Vol. 35, pp 5539–5544 (October 1996) by the inventors of the present application, the disclosure of which is incorporated herein by reference for all purposes.

The concentration of majority carriers Nd in Equation (1) may be obtained from the slope of the C-V characteristic curve. Namely the concentration of majority carriers Nd is expressed by Equation (2):

$$Nd = \frac{2}{q\varepsilon_0\varepsilon_{Si}} \cdot \frac{1}{\frac{d(1/Cs^2)}{dV}} \quad (2)$$

where q denotes an elementary charge, $\epsilon_0$ a permittivity in vacuum, $\epsilon_{Si}$ a relative dielectric constant of the semiconductor substrate, and Cs a measurement capacitance obtained by C-V characteristic measurement. The concentration of majority carriers Nd given by Equation (2) is used for calculation of the recovery time Tr expressed by Equation (1) as well as for analysis of the results of the C-t characteristic measurement.

As described above, a variety of parameters for C-t measurement can be obtained from the C-V characteristic. These parameters include the applied voltages Vacc and Vmeas and the recovery time Tr, which are parameters representing the conditions of C-t measurement, as well as the concentration of majority carriers Nd, which is a parameter used for analyzing the results of C-t measurement. As described in FIG. 11, the respective embodiments of the present invention first carry out C-V measurement with respect to each target area and then carry out C-t measurement using parameters obtained from the C-V characteristic. This procedure can readily carried out appropriate C-t measurement according to the surface conditions of each target area.

Figure 14:
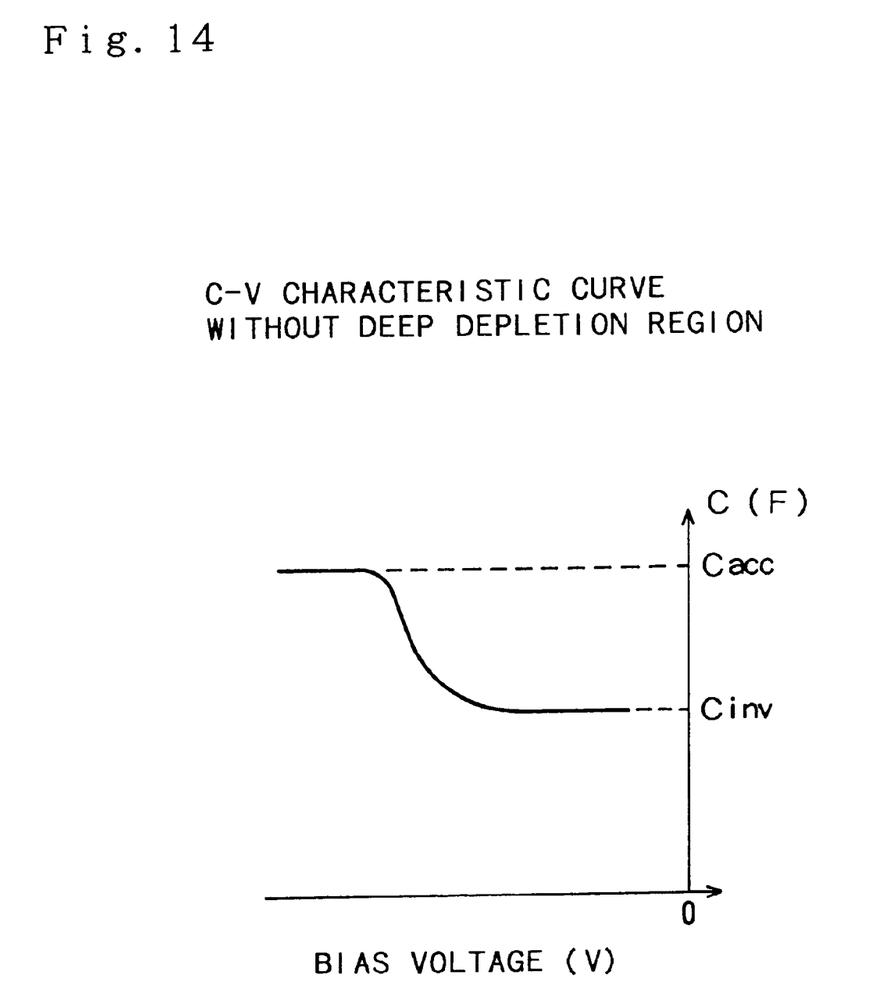
FIG. 14 is a graph showing a C-V characteristic curve including no deep depletion region.

When an extremely large number of defects exist in the vicinity of the surface of the target area and the life time τg of minority carriers is extremely short accordingly, the C-V characteristic curve may not include a deep depletion region (FIG. 13) as shown in FIG. 14. C-t measurement for the target area of such surface conditions does not give a C-t characteristic curve representing a transient variation as shown in FIG. 1(B) but gives only a stepwise variation in capacitance. The C-t measurement under such conditions does not give any significant results. When no deep depletion region appears in the C-V characteristic curve with respect to a certain target area like the example of FIG. 14, it is preferable that no C-t measurement is carried out for that target area. The parameter determination unit 322 (FIG. 6) carries out such determination, and the C-t measurement unit 324 receiving an instruction from the parameter determination unit 322 stops the execution of C-t measurement. This structure omits the useless C-t measurement, thereby saving the total measurement time.

Although he above embodiments are described using a non-contact-type measurement apparatuses in which a measuring electrode is located above a semiconductor wafer via an air gap, the present invention is also applicable to contact-type measurement apparatuses in which a measuring electrode is brought into contact with the surface of a semiconductor wafer via an insulating layer.

Part of the structure implemented by the hardware circuitry in the above embodiments may be implemented by software, while part of the structure implemented by the software may be implemented by hardware circuitry.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for measuring electrical characteristics of a semiconductor wafer, the apparatus comprising:
    a C-V measurement unit which carries out C-V measurement of a target area of the semiconductor wafer while a measuring electrode is located over the target area;
    a parameter determination unit which determines parameters used for C-t measurement of the target area, based on a C-V characteristic obtained by the C-V measurement; and
    a C-t measurement unit which carries out C-t measurement of the target area using the parameters determined by the parameter determination unit.

2. An apparatus in accordance with claim 1, wherein the parameters determined by the parameter determination unit include an accumulation voltage to be applied to the measuring electrode at the time of starting the C-t measurement and a measurement voltage to be applied to the measuring electrode after the application of the accumulation voltage, as conditions of the C-t measurement.

3. An apparatus in accordance with claim 2, wherein the parameter determination unit comprises:
    a unit which determines a flat-band voltage from the C-V characteristic; and
    a unit which determines the accumulation voltage and the measurement voltage by adding predetermined differences to the flat-band voltage.

4. An apparatus in accordance with claim 2, wherein the parameter determination unit comprises:
    a unit which determines the accumulation voltage and the measurement voltage based on a shape of a curve of the C-V characteristic.

5. An apparatus in accordance with claim 2, wherein the parameters determined by the parameter determination unit further include a measurement time for recording a C-t characteristic after the applied voltage is changed from the accumulation voltage to the measurement voltage.

6. An apparatus in accordance with claim 1, wherein the C-t measurement unit ceases from carrying out the C-t measurement when a deep depletion region does not appear in the C-V characteristic.

7. A method of measuring electrical characteristics of a semiconductor wafer, comprising the steps of:
    (a) carrying out C-V measurement of a target area of the semiconductor wafer while a measuring electrode is located over the target area;
    (b) determining parameters used for C-t measurement of the target area, based on a C-V characteristic obtained by the C-V measurement; and
    (c) carrying out C-t measurement of the target area using the parameters determined at the step (b).

8. A method in accordance with claim 7, wherein the parameters determined at the step (b) include an accumulation voltage to be applied to the measuring electrode at the time of starting the C-t measurement and a measurement voltage to be applied to the measuring electrode after the application of the accumulation voltage, as conditions of the C-t measurement.

9. A method in accordance with claim 8, wherein the step (b) comprises the steps of:
    determining a flat-band voltage from the C-V characteristic; and
    determining the accumulation voltage and the measurement voltage by adding predetermined differences to the flat-band voltage.

10. A method in accordance with claim 8, wherein the step (b) comprises the step of:
    determining the accumulation voltage and the measurement voltage based on a shape of a curve of the C-V characteristic.

11. A method in accordance with claim 8, wherein the parameters determined at the step (b) further include a measurement time for recording a C-t characteristic after the applied voltage is changed from the accumulation voltage to the measurement voltage.

12. A method in accordance with claim 7, wherein the step (c) comprises the step of:
    ceasing from carring out the C-t measurement when a deep depletion region does not appear in the C-V characteristic.

13. A computer program product measuring electrical characteristics of a semiconductor wafer, the computer program product comprising:
    a computer readable medium; and
    a computer program stored on the computer readable medium, the computer program comprising:
    a first program unit which causes a computer to carry out C-V measurement of a target area of the semiconductor wafer while a measuring electrode is located over the target area;
    a second program unit which causes the computer to determine parameters used for C-t measurement of the target area, based on a C-V characteristic obtained by the C-V measurement; and
    a third program unit which causes the computer to carry out C-t measurement of the target area using the parameters determined by the second program unit.

* * * * *